United States Patent [19]
Liotta

[11] Patent Number: 5,285,163
[45] Date of Patent: Feb. 8, 1994

[54] ELECTRICAL CABLE CONTINUITY AND VOLTAGE TESTER

[76] Inventor: William A. Liotta, 27520 N. Sierra Hwy., Apt. A206, Canyon Country, Calif. 91351

[21] Appl. No.: 879,271

[22] Filed: May 7, 1992

[51] Int. Cl.[5] .......................................... G01R 31/08
[52] U.S. Cl. ................................. 324/508; 324/539; 324/542; 324/556; 324/66; 324/133; 340/653; 340/656
[58] Field of Search ............... 324/508, 539, 542, 555, 324/556, 133, 66; 340/815.22, 653, 654, 656

[56] References Cited

U.S. PATENT DOCUMENTS

| | | | |
|---|---|---|---|
| 2,840,781 | 6/1958 | Ragonese | 324/542 |
| 3,718,859 | 2/1973 | Arlow | 324/72.5 |
| 4,074,245 | 2/1978 | Podany | 340/815.22 |
| 4,097,843 | 6/1978 | Basile | 340/656 |
| 4,164,701 | 8/1979 | Gulledge et al. | 324/508 |
| 4,164,702 | 8/1979 | Pereda | 324/508 |
| 4,225,817 | 9/1980 | Kahlden | 324/133 |
| 4,382,225 | 5/1983 | Peltz | 324/133 X |
| 4,670,709 | 6/1987 | Iredale | 324/542 |
| 4,929,887 | 5/1990 | Robitaille et al. | 324/66 |
| 5,043,670 | 8/1991 | Isfeld et al. | 324/508 |

*Primary Examiner*—Kenneth A. Wieder
*Assistant Examiner*—Glenn W. Brown
*Attorney, Agent, or Firm*—J. E. McTaggart

[57] ABSTRACT

A single hand-held tester performs both off-line continuity tests and on-line voltage tests for electrical cables and equipment such as that used in entertainment, studio or stage lighting. A test plug and a test socket fixed one at each end enable the tester to (a) plug into a power outlet socket to check for the correct presence of a.c. line voltage, (b) engage both ends of an extension cable to test continuity and correct wiring of each wire in the cable or (c) engage the plug end of an extension cable to provide audible indication of the continuity of a load such as a lamp connected to the cable. In a three-conductor (hot, ground and neutral) embodiment, a row of three test pushbuttons, one for each conductor, corresponds with an adjacent row of three LED continuity indicators. Three neon lamps indicate the presence of a.c. voltage between contact members of a power outlet under test. Special protective circuitry including a set of blocking diodes and a current-limiting lamp prevents accidental powerline overload or damage.

13 Claims, 2 Drawing Sheets

5,285,163

ELECTRICAL CABLE CONTINUITY AND VOLTAGE TESTER

FIELD OF THE INVENTION

The present invention relates to the field of electrical test equipment and more particularly it relates to a tester for trouble shooting and maintenance of electrical power outlets, flexible wiring cables and loads such as lamps, such as those utilized in professional studio and stage lighting in the entertainment and theatrical arts.

BACKGROUND OF THE INVENTION

The field addressed by the invention is characterized by intensive ongoing maintenance activity due to frequent changes in setups and severe wear and tear on the wiring, cables, power outlets, interconnection receptacles, lamps and related equipment. Certain electrical testing requirements which arise frequently and recurrently fall into two groups:

(1) off-line testing where there is no powerline voltage present: (a) verifying the correct hookup, isolation and general integrity of a typical three-wire extension cable by making continuity tests between all three contact members of both end connectors and (b) when only the plug end is available for testing while the socket end is connected to a load, such as a lamp, verifying the integrity of the load and any intervening cable(s) by a continuity test between the hot and neutral contact members at the plug end; and (2) on-line testing: testing outlet sockets for the presence of a.c. powerline voltage between the correct socket contact members in either (a) a fixed outlet socket or (b) an outlet socket at the end of a cable.

It is always possible to perform such testing with general-purpose electrical measuring equipment such as voltmeters and ohmmeters on an impromptu basis using such expedients as clip leads; however, such testing tends to be slow, laborious, and erroneous, and in on-line testing, lack of adequate insulating safeguards, e.g. the use of so-called "suicide cords", may cause a power outage if a short circuit trips a breaker, and the operator may be exposed to the risk of lethal or dangerous shock.

It has been known to organize such testing by providing customized test apparatus with a suitable mating socket and/or plug, including means for attaching suitable measuring instruments, for example as taught by Arlow in U.S. Pat. No. 3,718,859.

As a step further, it has been known to provide apparatus including some form of switching or selection means lo to facilitate several different continuity tests. Such apparatus as is presently known and available, including ohmmeters, voltmeters, and continuity testers, may be adaptable to address one or other aspect of various testing requirements separately, but not in the combination sought by the present invention.

Heretofore, the combination of off-line and on-line testing addressed by the present invention has typically required the use of at least two separate pieces of test apparatus and setups. Even if the various pieces of apparatus were to be combined in a single enclosure, there is a serious problem of isolating the continuity testing circuitry from the risk of damage from unintented presence of powerline voltage. One approach would be the use of two separate test connector plugs, one for the off-line continuity tests and the other for on-line voltage tests; however, since these plugs would have identical pinout configuration there would be a risk of unintentionally connecting the wrong plug to a powered outlet thus applying the powerline voltage directly to the continuity tester, heavily overloading the powerline as well as destroying the continuity tester. Other approaches such as switching schemes which rely on the user's vigilance, warning signs, etc., do not offer a "fail-safe" solution.

Thus there remains an unfulfilled need for a specialized single convenient combination continuity and line voltage tester, fitted with a single test plug and a test socket, to provide convenient, rapid, safe and unambiguous testing, both on-line and off-line, of electrical equipment such as a.c. powerline sources, cables, lamps and other loads as found in the practice of studio and stage lighting and the like.

OBJECTS OF THE INVENTION

It is a primary object of the present invention to provide a hand-held tester capable of both off-line continuity testing of extension cables and loads such as lamps, and on-line testing of a.c. powerline voltage outlets, in electrical maintenance and trouble-shooting as required, for example, in studio and stage lighting.

It is a further object that the tester be made capable of convenient, rapid and conclusive test performance in the lo intended field of service.

It is a further object that the tester be made safe against operator shock hazard and protected against risk of internal damage or powerline overload under any possible manipulation of user controls while the tester is connected is to powerline voltage.

SUMMARY OF THE INVENTION

The above objects have been met in the tester of this invention wherein a hand-held continuity and line voltage test instrument is provided with a fixed test plug at one end and a corresponding fixed test socket at the other end, enabling the instrument to be connected to a power outlet socket, both ends of an extension cable, or the plug end of an extension cable connected to a load. A set of operator switch controls includes a row of pushbuttons (typically three), one for each conductor, adjacent a corresponding row of LED visual continuity indicators. The presence of line voltage and correct pinout of a power outlet under test are indicated by a bank of neon lamps, one connected between each pair of test plug contact members. Special protective circuitry, including a current-limiting lamp and a set of blocking diodes prevent risk of accidental a.c. powerline-related overload or damage.

BRIEF DESCRIPTION OF THE DRAWINGS

The above and further objects, features and advantages of the present invention will be more fully understood from the following description taken with the accompanying drawings in which.

DETAILED DESCRIPTION

Figure 1:
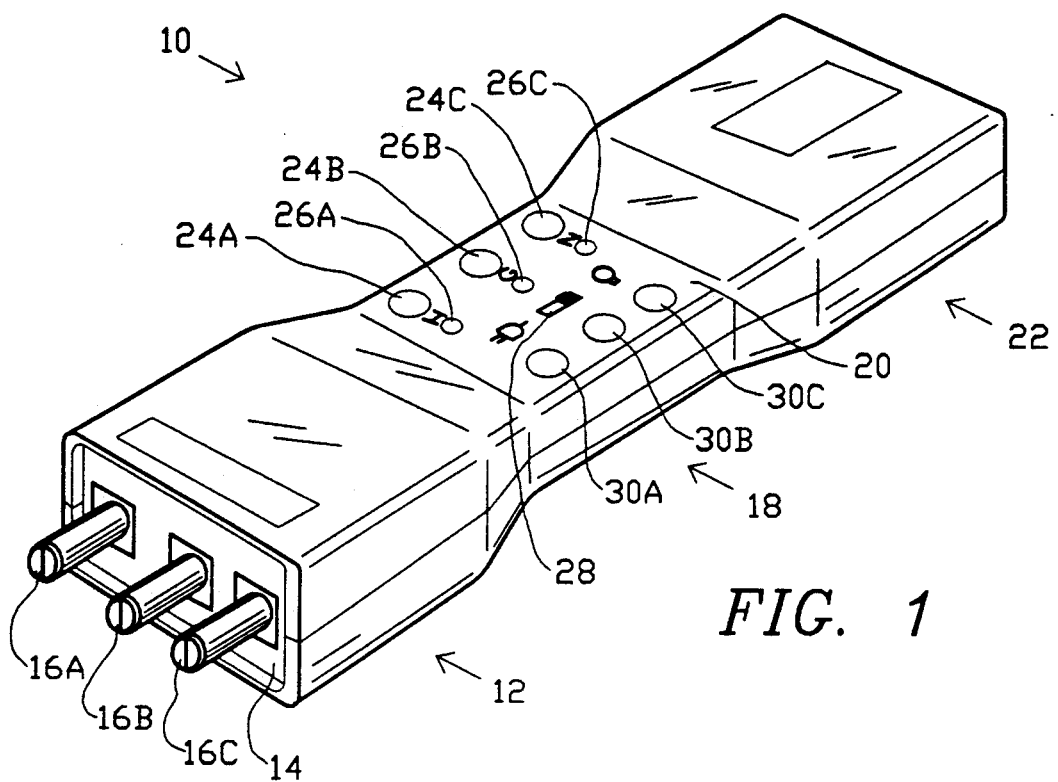
FIG. 1 is a perspective view of a continuity and voltage tester in a preferred embodiment of the present invention, showing the plug end and control panel.

FIG. 1 is illustrative of the present invention in a preferred embodiment: a tester 10 is housed in an elongated two piece molded plastic enclosure of generally rectangular cross section. Along its length three distinct portions are seen: a plug portion 12 to the left containing a test plug assembly 14 with three contact pins 16A, 16B and 16C extending out the end, a midsection 18 of reduced cross-sectional size providing a flat control panel 20, and a socket portion 22 to the right, with a cross-sectional size and shape the same as in the plug portion 12. This "dumbbell" shape makes the tester 10 comfortable to hold in the hand; also recessing the control panel 20 in this manner protects the components on the panel.

On the control panel 20, adjacent to the upper edge as shown is a row of three LED's 24A, 24B and 24C and an corresponding row of pushbuttons 26A, 26B and 26C, forming three columns which are designated H, G, and N to represent electrical hot, ground, and neutral circuit conductors, referring to the three plug pins 16A, 16B and 16C respectively. The LED's are red, green and clear respectively (optionally LED 24C could be colored yellow).

Located in a central region of the panel is a slide switch 28 for selecting the circuit routing of an internal battery to perform either a cable test mode as indicated by a plug symbol slider position indicator, or a load continuity test mode as indicated by a lamp symbol.

Located adjacent to the lower edge as shown is a row of neon lamps 30A, 30B and 30C, colored green, amber and green respectively, for inter-line voltage indication.

Figure 2:
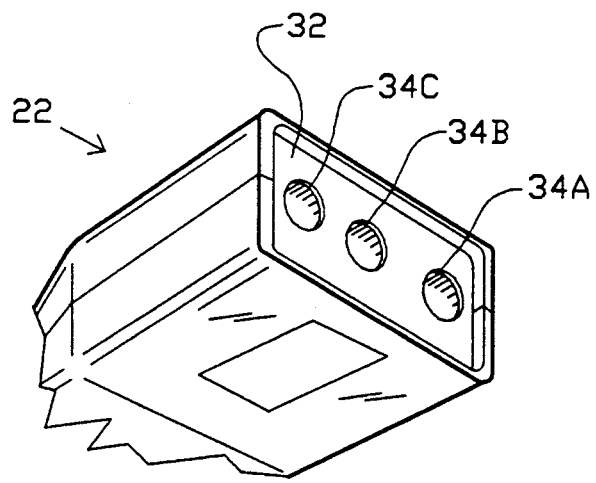
FIG. 2 is a perspective view of a portion of the tester shown in FIG. 1 showing the socket end.

FIG. 2 is a perspective view of the socket end 22, showing a test socket assembly 32 with three end-facing female contact members 34A, 34B and 34C in a standard stage pin connector configuration corresponding to pins 16A, 16B and 16C of FIG. 1.

Referring to FIGS. 1 and 2, the manner of operating the tester 10 will now be described in connection with its three main test functions, assuming that the connectors under test are of a type which is compatible with the tester:

(1) To test a live electrical power outlet, plug 14 is inserted into the outlet and neon lamps 30A, 30B and 30C are observed: normally only lamps 30A and 30C (the two green ones) should light up, while any indication from 30B (amber) signals a fault condition with an erroneous voltage between the neutral and ground. In this test the setting of slide switch 28 has no effect.

(2) To test an extension cable, switch 28 is set to the cable test position, indicated by the plug symbol, and both ends of the cable to be tested are connected to tester 10 via plug assembly 14 and socket assembly 32; then each pushbutton switch 26A, 26B and 26C is pressed sequentially: with a correctly wired cable, as each pushbutton is pressed, only the corresponding adjacent LED should respond. Any other response indicates a fault whose exact nature can be interpreted from the response pattern of the three LEDS. A tabulated fault analysis guide may be provided in a user instruction sheet.

(3) To test a load, such as a lamp (e.g. of a floodlight or spotlight), with an attached plug, possibly including one or more extension cables, switch 28 is set to the load test position, indicated by the lamp symbol, and the plug of the load under test is inserted into socket 32: if the load and its connections are intact, an internal buzzer sound will be heard immediately.

Figure 3:
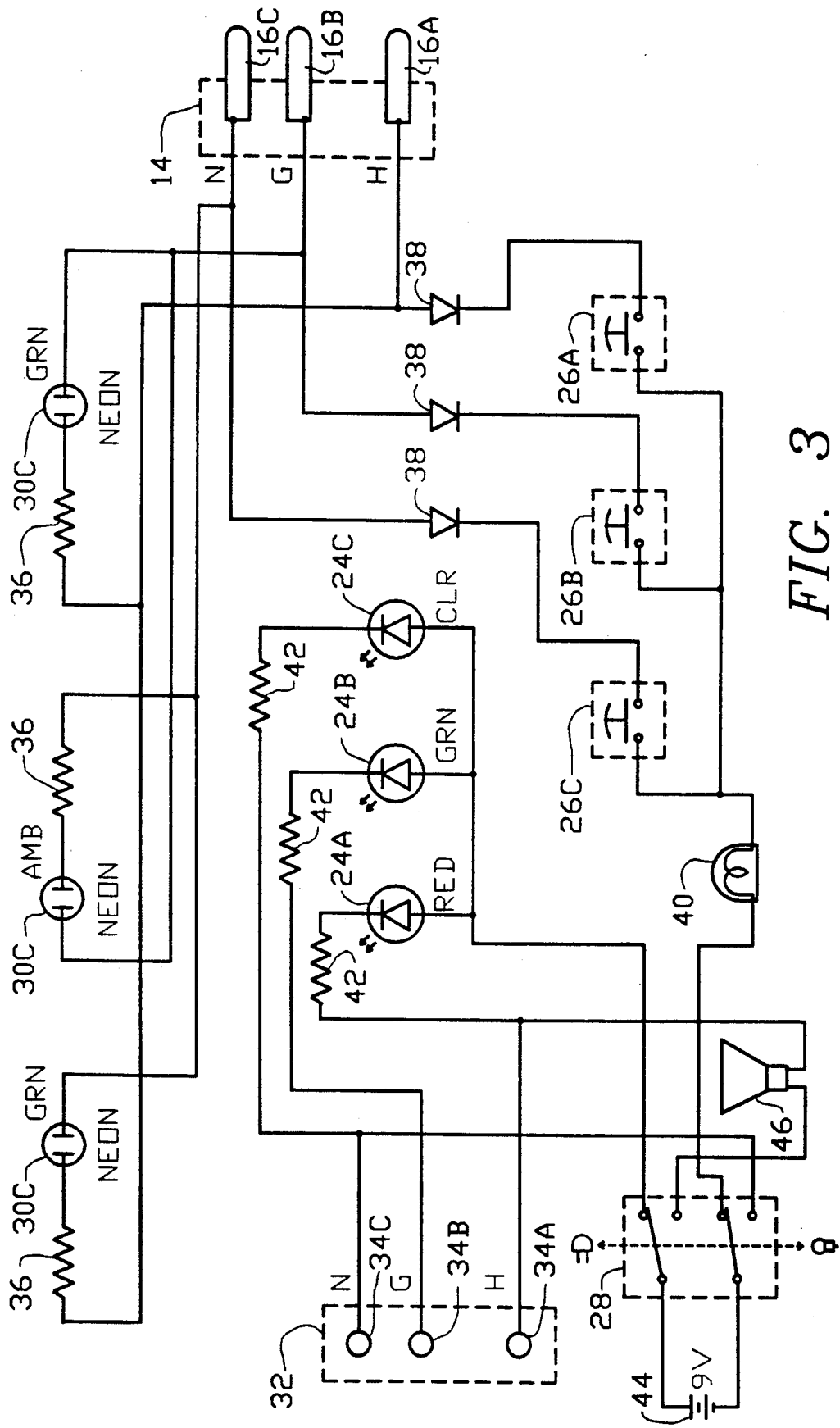
FIG. 3 is a schematic diagram of the tester of FIGS. 1 and 2.

FIG. 3 is a schematic diagram showing the wiring of the components in tester 10 of FIGS. 1 and 2. Neon lamps 30A, 30B and 30C are each connected in series with a 20 k ohm resistor 36 which allows the lamp to operate from 120 volts; the three branches thus formed are connected in a delta configuration to the contact pins 16A, 16B and 16C of plug 14 so that any voltage (above a threshold value) present between any two of the three pins 16A, 16B and 16C will illuminate the corresponding neon lamp. Normally the neutral pin 16C and ground pin 16B are at the same potential so that the amber colored lamp 30B receives no voltage, while the two green lamps 30A and 30C are energized to indicate normal supply voltage conditions at plug 14: thus any illumination of amber lamp 30B or lack of full brightness of green lamps 30A and 30C indicates a fault condition.

The pins 16A, 16B and 16C of plug 14 are also each connected via a diode 38, such as type 1N4004, to a first contact of pushbutton switches 26A, 26B and 26C respectively, and the second contacts of these are connected together to a first terminal of a protective lamp 40, rated at 110 volts, 25 milliamperes.

The female contact elements 34A, 34B and 34C of socket 32 are each connected via a 120 ohm resistor 42 (for current limiting) to LEDs 24A, 24B and 24C which are also connected in common to SPST slide switch 28 whose poles are connected to a 9 volt battery 44. Also connected to switch 28 in the manner shown are: (a) a first terminal of buzzer 46, typically a piezoelectric sonic transducer, whose other terminal is connected to the hot female contact member 34A, (b) the terminals of the three LEDs 24A, 24B and 24C connected in common, and (c) the second terminal of lamp 40.

Thus when switch 28 is set to the cable test position as shown, when a cable under test, connected to plug 14 and socket 32, is correctly wired, each pin of plug 14 is thus connected to a corresponding female contact member of socket 32; then, actuating pushbutton switch 26A completes the battery circuit through the corresponding adjacent red LED 24A, energizing it to indicate proper continuity of the hot circuit line through the cable under test. Similarly actuating pushbutton switch 26B energizes LED 24B to indicate continuity of the ground circuit, and actuating pushbutton switch 26C energizes LED 24C to indicate continuity of the neutral circuit.

When switch 28 is set to its other position, i.e. the load test position, indicated by the lamp symbol, and a power cable is plugged into socket 32, if there is a substantial load such as a lamp bulb connected to the other end of the cable, then a circuit is completed through battery 44 and buzzer 46, causing the buzzer 46 to sound and thus indicate the presence of the load; conversely, failure of the buzzer to sound indicates an open circuit such as a burnt out light bulb.

Diodes 38 act to block any fault current which could otherwise flow in excessive amount in a short circuit condition if any two of the pushbutton switches 26A-C were actuated simultaneously with plug 14 connected to a live power source.

Since the voltage test does not involve socket 32, there should be nothing connected to socket 32 during such testing; this is typically pointed out in the user instructions. However since the tester is intended to be completely safe and "idiot proof", incandescent lamp 40 is provided as a safeguard to limit possible fault current through any of the LEDs to a safe level (about 25 milliamperes) in the event of any contact interference with socket 32 while voltage testing is in progress via plug 14. In normal use, the filament of lamp 40 remains cold and introduces only a low resistance in the test circuit.

Switch 28 is provided as a means to allow the single battery 28 to be routed to either the cable test circuit or the load test circuit as selected by the switch setting; as an alternative, if two batteries are provided, one dedicated to the cable test circuit and the other to the load test circuit, then switch 28 may be eliminated.

As an alternative to the use of the three resistors 42, in series with LEDs 24A as shown in FIG. 3, a single resistor 42 could be inserted in series with the common line going to battery 28. This would cause reduced brightness of the LEDs if more than one pushbutton switch 26A-C is pressed simultaneously, however this is unimportant since the pushbuttons switches are intended to be actuated only one at a time.

Plug 14 and socket 32 as shown in the illustrative embodiment are of a commercial 20 ampere stage pin connector type, having ¼" round pins, used commonly in commercial studio and stage work; alternatively plug 14 and socket 32 may be of any configuration and current rating required: for example, the 15 ampere U-ground type or the 20 ampere twist lock type. The housing shape may be modified accordingly.

The concept of this invention may be readily applied to cables and connectors having more than three circuit conductors, and it would be possible with suitable circuit lo design changes to substitute alternative visual indicator types, e.g. incandescent lamps, in lieu of LEDs and neon lamps, and alternative type sonic transducers to implement buzzer 46; such modifications may be elected as a matter of design choice for implementing the invention.

In a simpler embodiment, the load testing capability could be omitted.

In an alternative housing and panel arrangement, neon lamps 3OA-C may be located on a different side of the housing from LEDs 24A-C and pushbuttons 38, such as on the opposite side.

The invention may be embodied and practiced in other specific forms without departing from the spirit and essential characteristics thereof. The present embodiments are therefore to be considered in all respects as illustrative and not restrictive, the scope of the invention being indicated by the appended claims rather than by the foregoing description; and all variations, substitutions and changes which come within the meaning and range of equivalency of the claims are therefore intended to be embraced therein.

What is claimed is:

1. A hand-held electrical tester for testing electrical extension cables and energized power outlets, comprising:
    an insulated elongated housing having a plug end portion, a central portion, and a socket end portion opposite the plug end portion;
    an electrical plug, disposed in the plug end portion, having a plurality of male contact members;
    an electrical socket, disposed in the socket end portion, having a plurality of female contact members;
    a plurality of like user-operable test switches each in a plug circuit branch having a first node connected to a corresponding one of said male contact members;
    a plurality of visual indicators each in a socket circuit branch having a first node connected to a corresponding one of the female contact members;
    a battery, contained in said housing;
    cable test circuit means interconnecting the male contact members, said test switches, said battery, said visual indicators and the female contact members in a manner such that, when a correctly wired cable is connected to said plug and said socket, actuation of any one of said test switches is caused to energize a corresponding one of said visual indicators so as to indicate correct wiring the cable, said plug circuit branches each having a second node connected in common to a first node of a cable test circuit branch, said socket circuit branches each having a second node connected in common to a second node of the cable test circuit branch, and said battery being provided with battery connection means for connecting said battery in series in the cable test circuit branch; and
    a plurality of visual voltage-indicating devices each connected between a different pair of the male contact members, whereby correct powering of an electrical outlet under test by engagement with said plug is indicated by illumination of only predetermined ones of said voltage-indicating devices.

2. The electrical tester as defined in claim 1 wherein said cable test circuit means further comprises, in each of the plug circuit branches, a diode connected in series with each switch in like polarity so as to prevent closure of any of said switches from forming a conductive path between any of said male contact members.

3. The electrical tester as defined in claim 2 wherein said pluralities of male contact members, female contact members, test switches and visual indicators each comprise a quantity of three, designated hot, ground and neutral correspondingly.

4. The electrical tester as defined in claim 1, for a further purpose of testing load continuity, comprising:
    a load-indicating device connected in series in a load test circuit branch having nodes connected to a designated pair of said female contact members; and
    a power source, connected in series in the load test circuit branch, enabling said load-indicating device to indicate the presence of an external load connected via said socket across the load test circuit branch.

5. The electrical tester as defined in claim 4 wherein said load test circuit means comprises a user-operable mode switch connected so as to enable connection of said battery to be transferred back and forth between the cable test circuit branch and the load test circuit branch wherein said battery is made to constitute said power source.

6. The electrical tester as defined in claim 4 wherein said indicating device comprises an electro-sonic transducer.

7. The electrical tester as defined in claim 1 further comprising an incandescent lamp connected in series in the cable test circuit branch to act as a current limiting device to prevent circuit damage in the event of unintended contact to said socket while said plug is connected to a source of powerline voltage.

8. The electrical tester as defined in claim 1 wherein said voltage-indicating devices each comprise a neon lamp and a series resistor.

9. The electrical tester as defined in claim 1 wherein in said housing the plug end portion and the socket end portion are made to be substantially similar and rectangular in cross-section, and the central portion is made to have a substantially rectangular-cross section smaller than that of the first and second end portions, so as to provide a convenient hand grip.

10. A hand-held electrical tester for testing electrical extension cables and energized power outlets, comprising:

an insulated elongated housing of substantially rectangular cross section having a plug end portion, a central portion of reduced cross-sectional size, and a socket end portion opposite the plug end portion, substantially similar in cross-section to the plug end portion;

an electrical plug, disposed in the plug end portion, having three male contact members designated hot, ground and neutral;

an electrical socket, disposed in the socket end portion, having three female contact members complementary to said male contact members;

three like pushbutton switches each connected in series in a corresponding plug circuit branch having a first node connected to a corresponding one of said male contact members and having a second node connected in common to a first node of a cable test circuit branch;

three diodes, one in each of the plug circuit branches connected in series with the switch in like polarities;

three LEDS, including resistive current limiting means, each LED being connected in series in a corresponding socket circuit branch having a first node connected to a corresponding one of the female contact members and having a second node connected in common to a second node of the cable test circuit branch;

an incandescent lamp connected in series in the cable test circuit branch for fault current limiting purposes;

three voltage-indicating branches each comprising a neon lamp in series with a resistor, each branch having as nodes a different pair of the male contact members whereby a voltage exceeding a predetermined threshold, appearing between any pair of said male contact members will illuminate a corresponding neon lamp; and first battery means providing a series power source in the cable test circuit branch:

whereby,
(1) a cable under test connected to said socket and said plug may be tested for correct wiring and integrity by pressing each of said pushbutton switches in sequence and observing visual indication of each corresponding LED, when a battery transfer switch is set to the cable test state; and (2) correct powering of an electrical outlet under test by engagement with said plug is indicated by illumination of only a predetermined pair of the neon lamps.

11. The electrical tester as defined in claim 10 having a further capability of load testing, further comprising:

an electro-sonic indicating device connected in series in a load test circuit branch having as nodes the hot and the neutral female contact members;

second battery means for providing a series power source in the load test circuit branch;

whereby the presence of an external load under test, which is connected via a connector plug to said socket, is indicated by said electro-sonic indicating device.

12. The electrical tester as defined in claim 11 wherein said first and second battery means comprise:

a battery, contained in said housing; and a user-operable DPDT battery transfer switch having two poles connected to two terminals of said battery, a pair of contacts connected to a battery circuit branch and a pair of contacts connected to said load test circuit branch, whereby setting said switch to a cable test position connects the battery into the cable test circuit branch and setting said switch to a load test position connects the battery into the load test circuit branch.

13. The electrical tester as defined in claim 11 wherein said three LEDs are disposed in a row adjacent a corresponding row of said pushbutton switches, forming three columns designated H, G and N, corresponding to hot, ground and neutral designations of said male and female contact members.

* * * * *